US011225713B2

(12) United States Patent
Lock et al.

(10) Patent No.: US 11,225,713 B2
(45) Date of Patent: *Jan. 18, 2022

(54) STABLE IR TRANSPARENT CONDUCTIVE GRAPHENE HYBRID MATERIALS AND METHODS OF MAKING

(71) Applicant: The Government of the United States of America, as represented by the Secretary of the Navy, Washington, DC (US)

(72) Inventors: Evgeniya H. Lock, Alexandria, VA (US); Nicholas A. Charipar, Alexandria, VA (US); Alberto Piqué, Crofton, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/492,728

(22) Filed: Apr. 20, 2017

(65) Prior Publication Data

US 2017/0321321 A1 Nov. 9, 2017

Related U.S. Application Data

(60) Provisional application No. 62/332,961, filed on May 6, 2016.

(51) Int. Cl.
*B32B 9/00* (2006.01)
*C23C 16/26* (2006.01)
(Continued)

(52) U.S. Cl.
CPC .............. *C23C 16/26* (2013.01); *C23C 16/01* (2013.01); *C23C 16/56* (2013.01); *H01B 1/04* (2013.01);
(Continued)

(58) Field of Classification Search
CPC ..... Y10T 428/30; C01B 31/04; C01B 31/446; B82Y 30/00
(Continued)

(56) References Cited

U.S. PATENT DOCUMENTS

2011/0143101 A1\* 6/2011 Sandhu ................. B82Y 30/00
428/195.1
2012/0244358 A1 9/2012 Lock
(Continued)

FOREIGN PATENT DOCUMENTS

KR 10-1618974 B1 5/2016

OTHER PUBLICATIONS

Bae, Sukang, et al. "Roll-to-roll production of 30-inch graphene films for transparent electrodes." Nature nanotechnology 5.8 (2010): 574-578.
(Continued)

*Primary Examiner* — Daniel H Miller
(74) *Attorney, Agent, or Firm* — US Naval Research Laboratory; Rebecca L. Forman (57) ABSTRACT

A method of making a transparent conductive graphene hybrid, comprising the steps of providing a PMMA/Graphene hybrid, functionalizing the PMMA/Graphene hybrid, providing a transparent substrate, oxidizing the transparent substrate, treating the oxidized substrate and forming a functionalized substrate, applying the PMMA/Graphene hybrid to the functionalized substrate, removing the PMMA, and forming a transparent conductive graphene hybrid. A transparent conductive graphene hybrid comprising a transparent substrate, wherein the transparent substrate is oxidized, and wherein the transparent substrate is treated with TFPA-NH2 to form a functionalized substrate, and a layer of graphene on the functionalized substrate.

16 Claims, 11 Drawing Sheets

(51) Int. Cl.
*C23C 16/01* (2006.01)
*C23C 16/56* (2006.01)
*H01B 1/04* (2006.01)
*H01B 5/14* (2006.01)
*H01B 13/00* (2006.01)
*B82Y 30/00* (2011.01)

(52) U.S. Cl.
CPC ........... *H01B 5/14* (2013.01); *H01B 13/0036* (2013.01); *B82Y 30/00* (2013.01); *Y10T 428/30* (2015.01)

(58) Field of Classification Search
USPC ........................... 428/408; 423/448; 252/500
See application file for complete search history.

(56) References Cited

U.S. PATENT DOCUMENTS

| | | | |
|---|---|---|---|
| 2014/0001152 A1* | 1/2014 | Zurutuza Elorza | C01B 31/0484 216/36 |
| 2014/0193626 A1* | 7/2014 | Ozyilmaz | H01B 1/04 428/220 |
| 2014/0284552 A1* | 9/2014 | Kub | H01L 29/66242 257/26 |
| 2014/0291819 A1 | 10/2014 | Barth | |
| 2014/0308449 A1 | 10/2014 | Zhamu | |
| 2014/0313562 A1 | 10/2014 | Ruoff et al. | |
| 2015/0125952 A1* | 5/2015 | Kim | A61L 27/14 435/366 |
| 2015/0153873 A1 | 6/2015 | Lee et al. | |
| 2016/0280980 A1* | 9/2016 | Sjong | C09K 5/14 |

OTHER PUBLICATIONS

Bae, Sukang, et al. "Towards industrial applications of graphene electrodes." Physica Scripta 2012.T146 (2012): 014024.

Jo, Gunho, et al. "The application of graphene as electrodes in electrical and optical devices." Nanotechnology 23.11 (2012): 112001.

Bult, Justin B., et al. "Role of dopants in long-range charge carrier transport for p-type and n-type graphene transparent conducting thin films." ACS nano 7.8 (2013): 7251-7261.

Kim, Yong-Jin, et al. "Engineering electrical properties of graphene: chemical approaches." 2D Materials 2.4 (2015): 042001.

* cited by examiner

Fig. 1A One Step Graphene Transfer (OSGT)

Fig. 1B Modified One Step Graphene Transfer (MOSGT)

Fig. 7A Sequential Graphene Transfer (SGT)

Fig. 7B Modified Sequential Graphene Transfer (MSGT)

STABLE IR TRANSPARENT CONDUCTIVE GRAPHENE HYBRID MATERIALS AND METHODS OF MAKING

REFERENCE TO RELATED APPLICATION

This application is a non-provisional of, and claims priority to and the benefits of, U.S. Provisional Patent Application No. 62/332,961 filed on May 6, 2016, the entirety of which is hereby incorporated by reference.

BACKGROUND

This disclosure teaches a method to produce conductive IR transparent hybrid materials on organic and inorganic materials without loss of electrical properties over time.

Since its discovery in 2004, a monolayer of $sp^2$ carbon called graphene, has attracted extensive amount of research (over 14,000 papers with the keyword grapheme). This is due to its extremely high carrier mobility (>200 000 $cm^2V^{-1}s^{-1}$), a room temperature quantum Hall effect, a tremendously high optical transparency of 97.7% can capture broader spectrum than conventional semiconducting materials, a high Young's modulus (1 TPa), and extraordinarily large specific surface area of 2630 $m^2/g^{-1}$. Graphene applications range from high end physics instrumentations, metrology, electronics, spintronics, photonics and optoelectronic devices, sensors, flexible electronics, as well as energy storage devices such as batteries, supercapacitors, solar cells and in biomedical applications as single molecule screening devices, targeted drug delivery systems, etc.

Graphene has attracted a lot of attention for its promise as a transparent conductor. Indeed, depending on the sheet resistance in $\Omega$/sq $inch^{-1}$, it can be used as touch screens (400-500 $\Omega$/sq $inch^{-1}$), smart windows (300-400 $\Omega$/sq $inch^{-1}$), flexible Organic Light Emitting Diode (OLED)/Liquid Crystal Display (LCD) displays (25-300 $\Omega$/sq $inch^{-1}$), and solar cells (1-10 $\Omega$/sq $inch^{-1}$). The state of the art transparent conducting materials (indium tin oxide (ITO) or fluorine doped tin oxide (FTO)) are currently the most expensive parts of a dye-sensitized solar cell. In addition, these oxides are typically deposited at high temperatures beyond the thermal limit of polymers, and their brittleness is a drawback when flexibility is required. For example, resistivity of 100 Ohm/sq was obtained by graphene functionalization with $HNO_3$.

Although combined low resistivity (<10 $\Omega$/sq) and high transparency in the graphene transparent conductors has not been achieved yet, graphene has shown promise. Reduction of graphene resistivity to 50 Ohm/sq was obtained by stacking single graphene layers (4 sequential single layer transfers) and then functionalization of the top surface by $HNO_3$. The lowest reported value was by Hong of 30 Ohm/sq. Other solvents were tried as well—$SoCL_2$, $H_2SO_4$, nitromethane, HCl. However, the final graphene surfaces are unstable. Bult et. al. discussed the role of dopants on carrier transport for graphene transparent conducting thin films. They used hydrazine doping performed in helium glove box, nitric acid dip and polyethyleneimine in air. They achieved 50 Ohm/sq for 89% transmission. However, they also show change in electrical performance of hydrazine functionalized devices within 150 seconds of exposure to air. Graphene surface functionalization with diethylenetriamine (DETA) in vapor phase which induces n-type doping was shown by Y. Kim et. al. When this is combined with substrate-induced doping using amine-functionalized self-assembled covered $SiO_2$/Si, the group shows that graphene's sheet resistance is reduced to 86 Ohm/sq. The issue with surface stability was not analyzed.

SUMMARY OF DISCLOSURE

Description

This disclosure pertains to a conductive IR transparent hybrid material on organic and inorganic materials without loss of electrical properties over time, and methods of making.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

FIG. 8 illustrates optical and electrical measurements of Gr/$Al_2O_3$ hybrid materials obtained using sequential transfer method. Sample 1 was prepared by using 2 L/2 L graphene on $Al_2O_3$ sample, functionalizing it with TFPA and then transferring 3 L bottom functionalized graphene with $HNO_3$ onto it. Sample 2 was prepared by using 2 L/2 L graphene on $Al_2O_3$ sample, functionalizing it with TFPA and then transferring 3 L bottom functionalized graphene with $HNO_3$ onto it and then functionalizing the top surface with TFPA. Sample 3 was prepared by using 6 L graphene on $Al_2O_3$ sample, functionalizing it with TFPA and then transferring 1 L bottom functionalized graphene with $HNO_3$ onto it. Sample 4 was prepared by using 3 L graphene on $Al_2O_3$ sample, functionalizing it with TFPA and then transferring 2 L bottom functionalized graphene with $HNO_3$ onto it. Sample 5 was prepared by using 2 L graphene on $Al_2O_3$ sample, functionalizing it with TFPA and then transferring 3 L bottom functionalized graphene with $HNO_3$ onto it.

DETAILED DESCRIPTION OF THE INVENTION

A stable IR transparent conductive graphene hybrid material, and methods of making, are disclosed herein.

The conductive graphene hybrid materials are without loss in electrical properties over time.

The proof of concept experiments were performed with commercially available graphene (Gr) grown by chemical vapor deposition on Cu foils. Both single and multilayer graphene (2 layers, 3-5 layers, 6-8 layers from ACS Materials) were used. The transparent substrates used were sapphire and germanium wafer (doubly polished). However, the proposed method is applicable to any transparent substrate (organic and inorganic), considering that its surface needs to be oxidized before transfer to enhance adhesion of graphene to it.

To produce graphene-based hybrid material, graphene must be removed from the Cu foil and placed onto the substrate of interest. Different methods have been developed to achieve this result. They can generally be divided into dry and wet chemical approaches. The wet chemical methods rely on wet chemical etch of the Cu foil, while the top surface of the graphene is preserved by a sacrificial polymeric layers. The main drawback is cleaning of the polymeric residue from the graphene surface on atomic scale. The dry approaches reply on mechanical peeling of the graphene without exposure to chemicals. Lock et. al. discovered a method that relies on differential adhesion with the basic idea that if the graphene's adhesion to the target substrate is higher than the adhesion between graphene and the Cu foil, graphene would be transferred (U.S. patent application Ser. No. 13/466,248). In this work, wet chemical approach was used as explained below. However, the same concept can be applied using a dry transfer approach as well.

Example 1

Figure 1A:
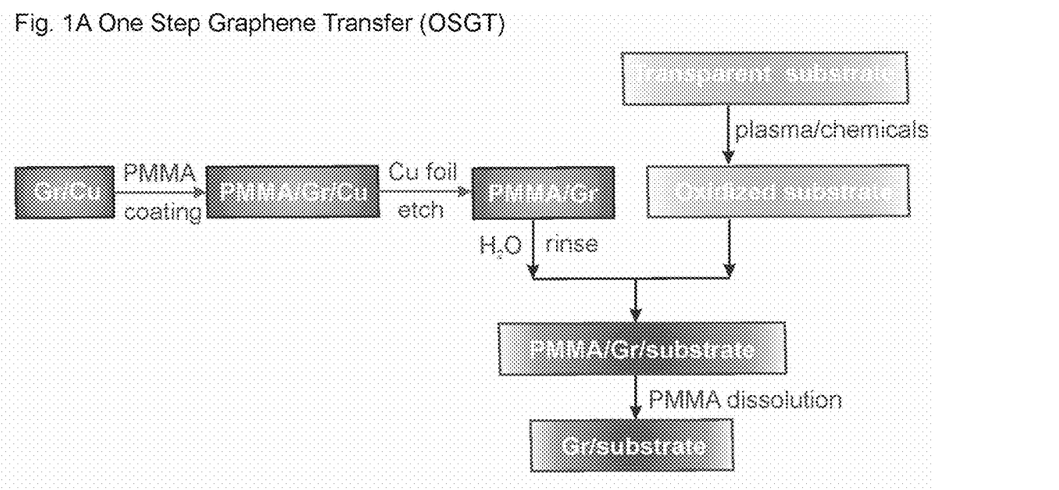
FIG. 1A is a schematic of one step graphene transfer.
Figure 1B:
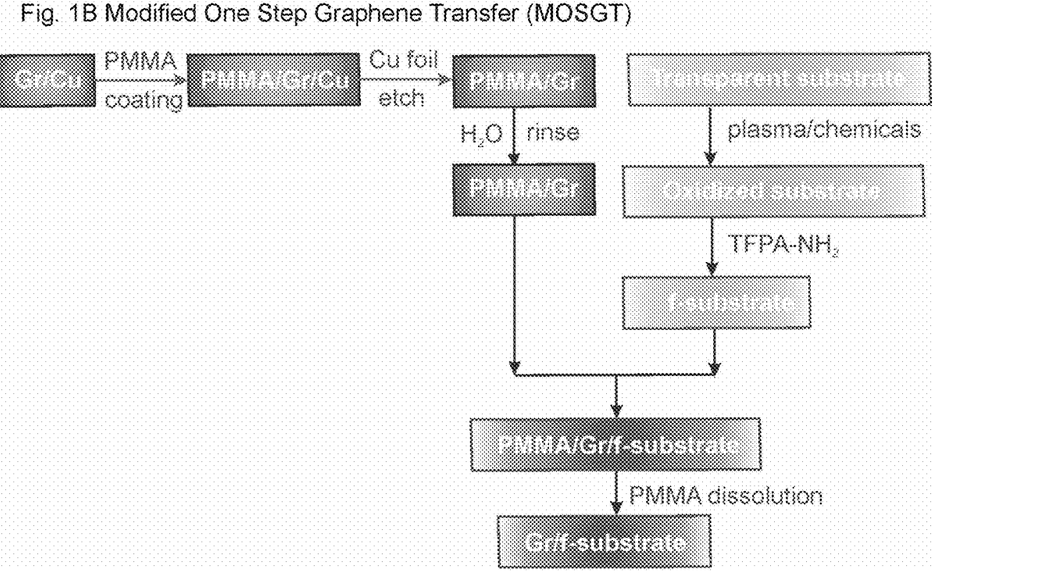
FIG. 1B is a schematic of a modified one step graphene transfer.

In the wet chemical approach both one step transfer and multiple sequential transfers were used. Schematics of the one step graphene transfer (OSGT) and the modified one step graphene transfer (MOSGT) methods are shown in FIG. 1. In the one step graphene transfer, graphene surfaces was coated by PMMA at 4000 rpm for 1 min, then placed in APS 100 Cu etchant for 8 hours. Then the PMMA/Gr hybrid was placed in deionized water for 12 hours to rinse the metal residues from the graphene surface. Separately, the surface of the transparent substrate was treated chemically or by plasma to produce highly oxidized surface. Germanium surface was plasma functionalized using microwave Plasma Preen System in argon or oxygen environment for 1 minute. The sapphire was first immersed into sc1 solution for 10 minutes (DI $H_2O$:$H_2O_2$:$NH_4OH$ 6:1.5:1 80° C.), followed by HF etch for 1 minute (49% HF in $H_2O$ 1:100) and sc2 incubation ($H_2O$:$H_2O_2$:HCl7 1:1.5:1 80° C.) for 10 minutes. Then, the PMMA/Gr hybrid was scooped with the modified target surface. Then, the PMMA/Gr/substrate was placed on hot plate at 60° C. for a few minutes, followed by bake at 120° C. for 1 minute. The PMMA film was removed by acetone dip for 1 minute, followed by rinse in isopropanol and dried with nitrogen. In the MOSGT transfer, the effect of functionalization of target surface on graphene's electrical properties was explored. The oxidized target substrates (UHMW PE, sapphire and germanium) were further functionalized with TFPA-$NH_2$ solution in methanol by dip coating for two hours. This functionalization can be expanded to other chemical, plasma-based functionalizations as well as target surface modification by self assembled monolayers (e.g. silane-based).

Figure 2:
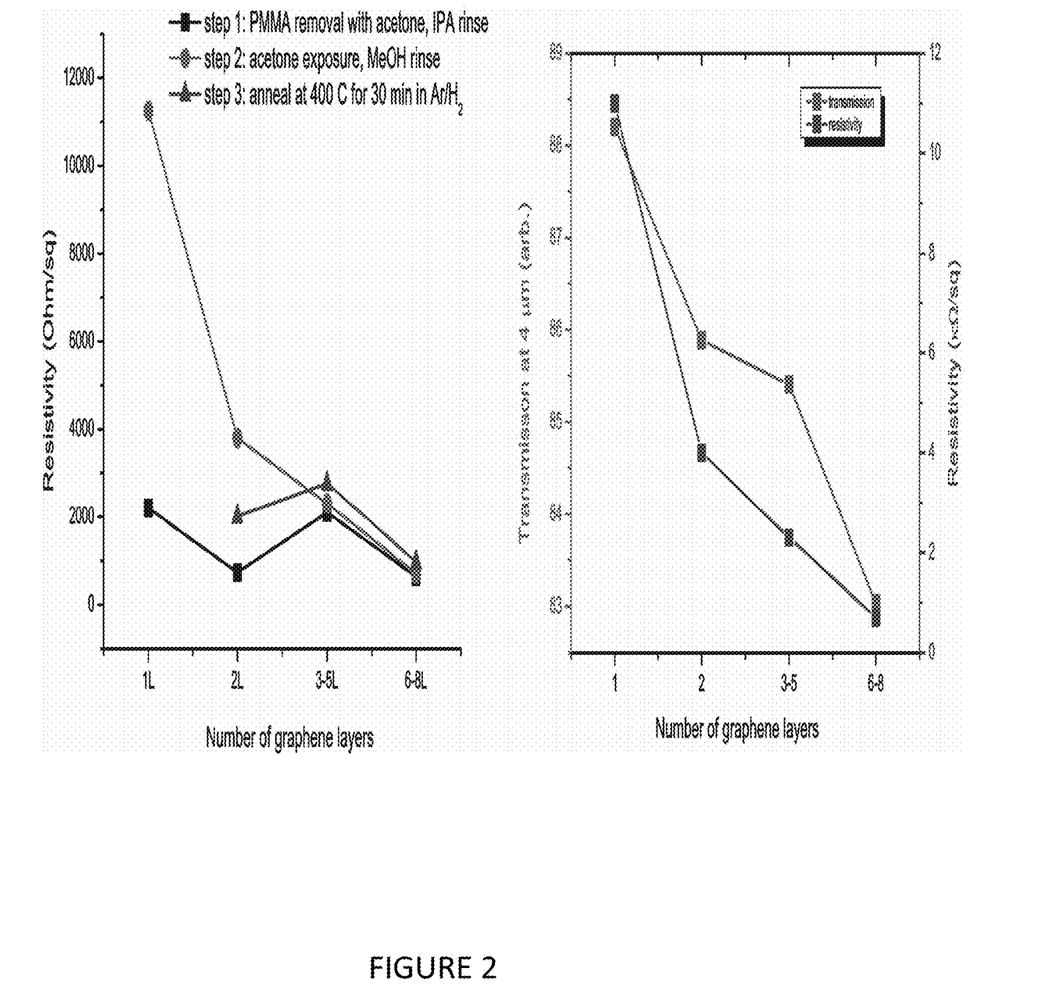
FIG. 2 illustrates electrical and optical properties of graphene/$Al_2O_3$ hybrid materials after one step graphene transfer of single and multilayer graphene.

The electrical and optical properties of graphene/$Al_2O_3$ hybrids produced by the one step transfer of single and multilayer graphene are shown in FIG. 2. It should be noted that the graphene surface is very sensitive to polymeric residues after the transfer, as well as to its post-treatment. Methanol rinse increased the sheet resistance of the single and double layer graphene surfaces. Additional annealing step in Ar/$H_2$ mixture was needed to reduce their resistance values. The obtained resistance values were in the kΩ/sq range. The lowest values were obtained using 6 layers graphene 800 Ω/sq. The transmission of the Gr/$Al_2O_3$ hybrid was reduced proportional to the number of the graphene layers.

Figure 3:
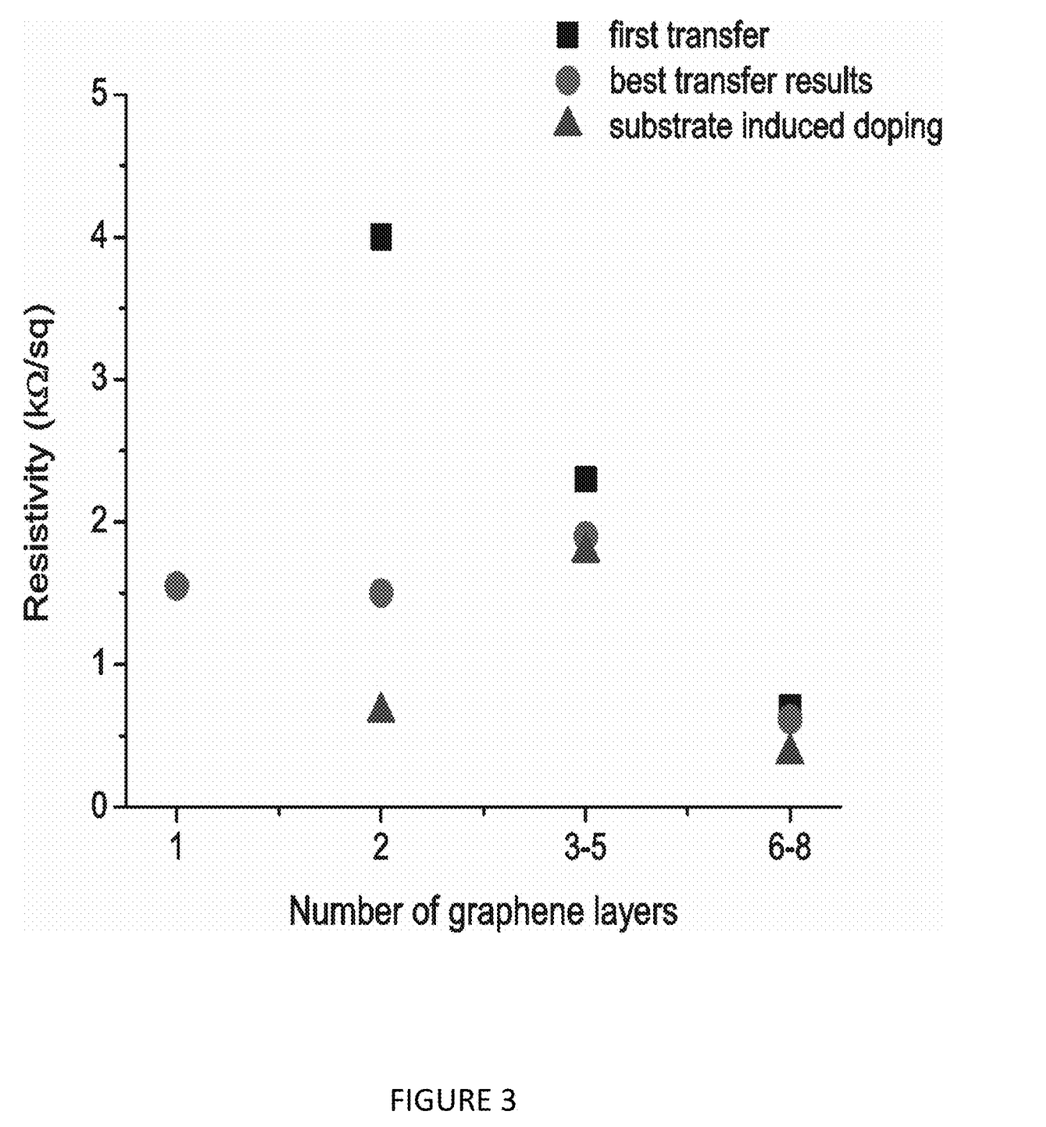
FIG. 3 illustrates comparison of sheet resistance of graphene/$Al_2O_3$ as a function of number of graphene layers and $Al_2O_3$ surface induced doping.
Figure 4:
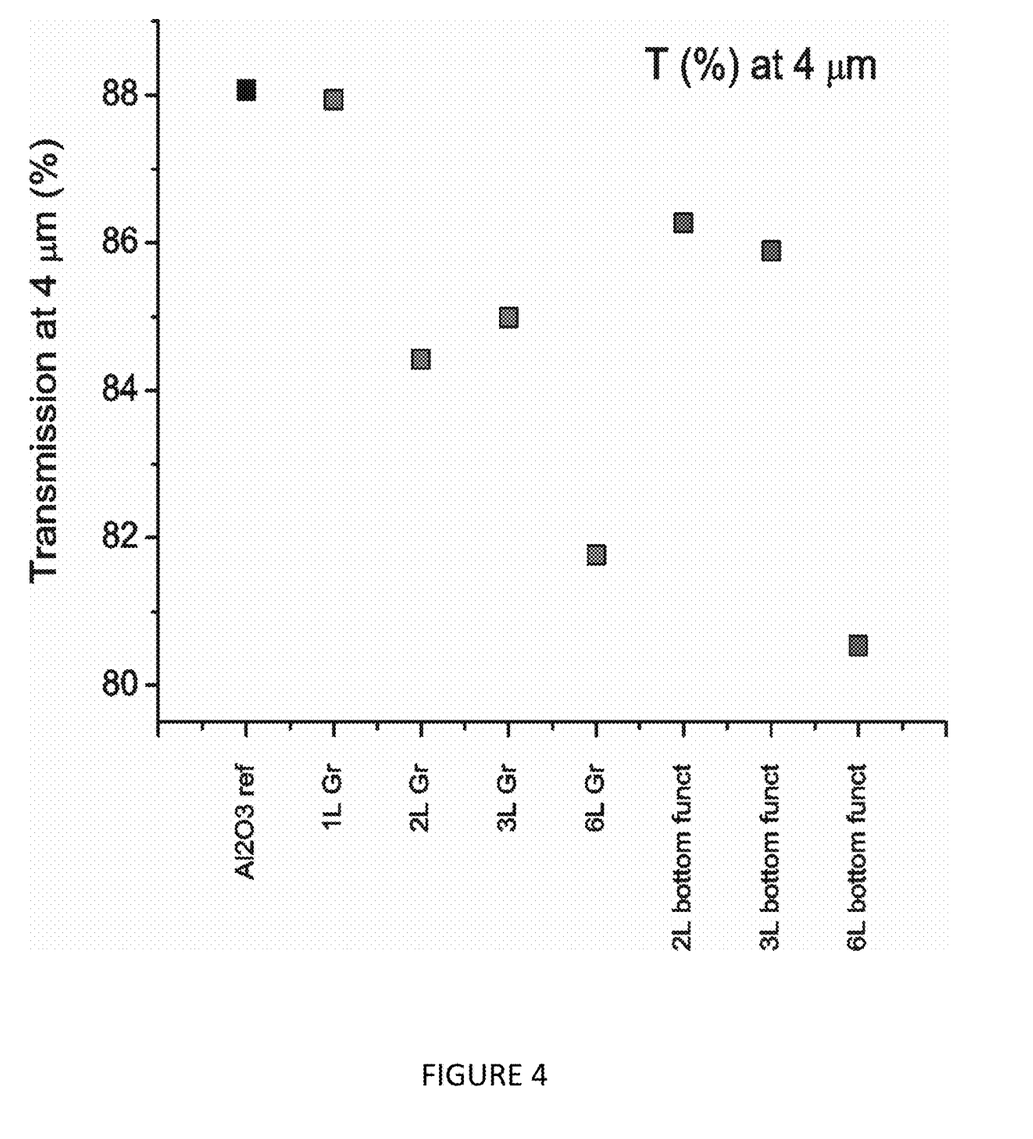
FIG. 4 illustrates transmission of graphene/$Al_2O_3$ as a function of number of graphene layers and $Al_2O_3$ surface induced doping.

Multiple attempts were made to optimize the OSGT by use of different PMMA resists, and methods for PMMA removal. The best results are shown in FIG. 3—lower resistivity values were obtained for the transfer of single and double layers of graphene (1.5 kΩ/sq). The multilayers (3 L, 6 L) were not affected. In further attempt to minimalize the resistance of the Gr/$Al_2O_3$ hybrids the MOSGT method was applied. As shown in FIG. 3, the resistance of double layer graphene sample was further reduced. The transmission values of the graphene/$Al_2O_3$ produced by this method are shown in FIG. 4 suggest that substrate functionalization dos not significantly affect the optical properties of the hybrids.

Figure 5:
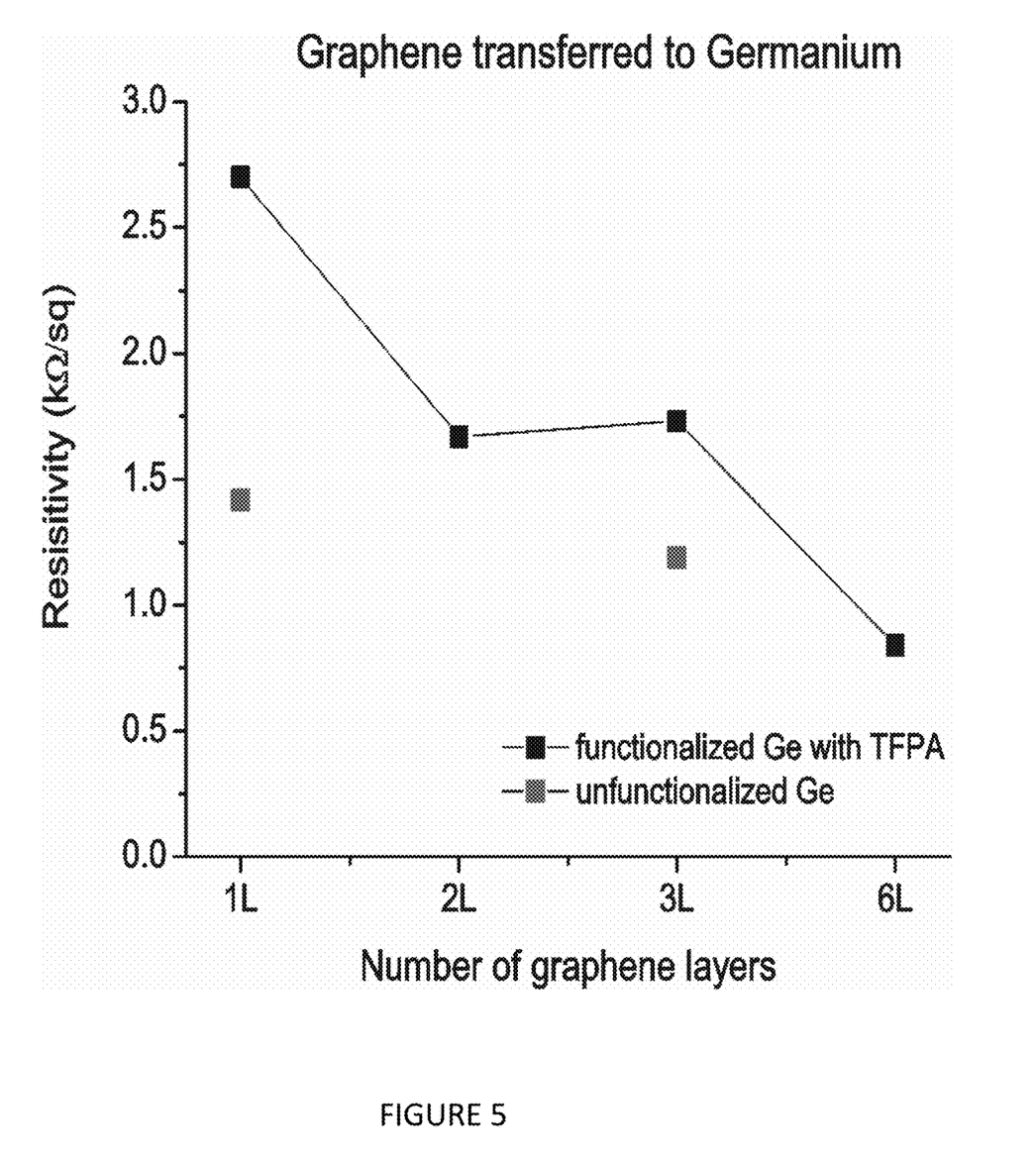
FIG. 5 illustrates comparison of sheet resistance of graphene/Ge as a function of number of graphene layers and Ge surface induced doping.
Figure 6:
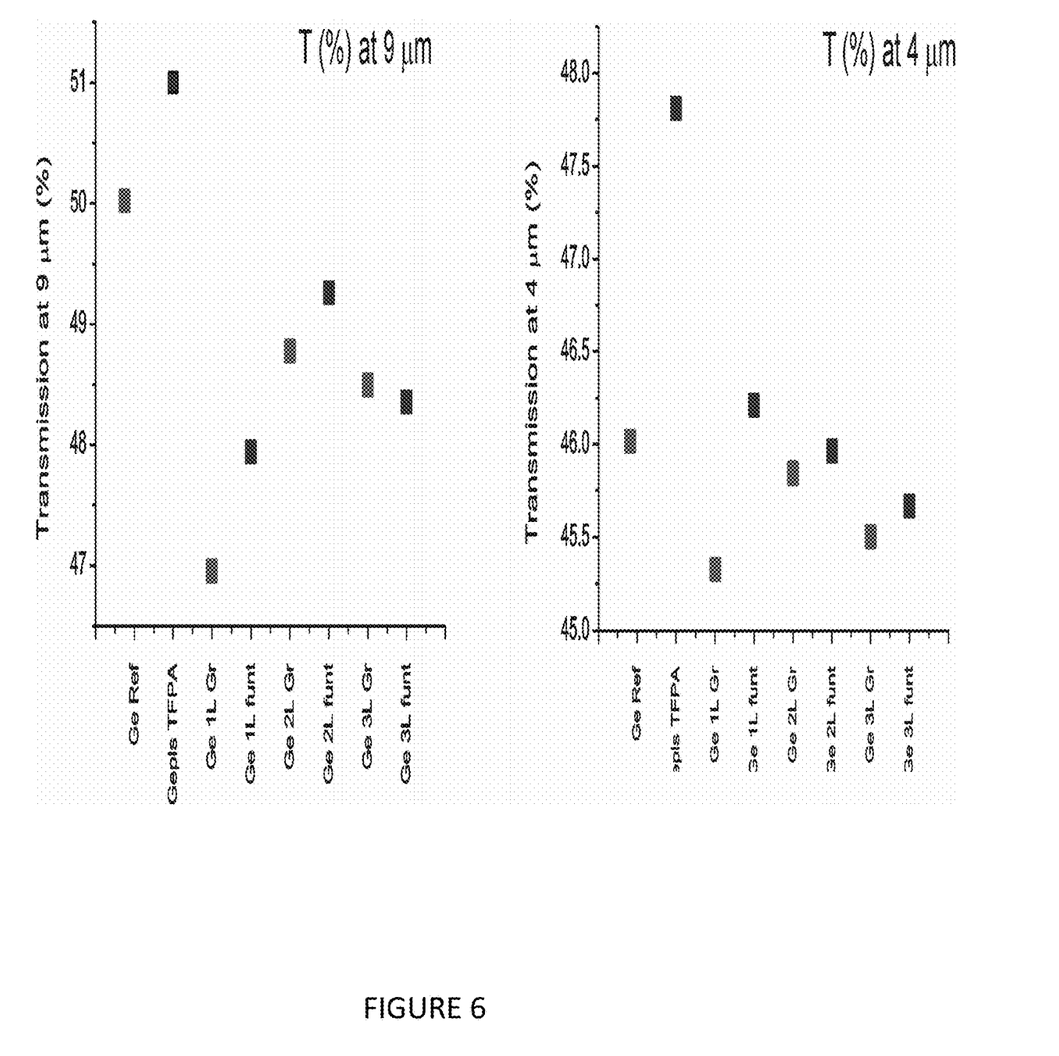
FIG. 6 illustrates transmission of graphene/Ge as a function of number of graphene layers and Ge surface induced doping in the IR wavelengths 4 µm and 9 µm.

FIG. 5 shows the results from the OSGT and MOSGT transfer of single and multilayer graphene to germanium. The obtained resistance values were in the kΩ/sq range with the lowest value achieved when 6 L of graphene was used consistent with previous results. The functionalization of germanium did not decrease the sheet resistance values of graphene as was the case with $Al_2O_3$. Transmission of germanium and Gr/germanium hybrids after the OSGT and MOSGT methods at two wavelengths (4 and 9 µm) are shown in FIG. 6—insignificant decrease of transmission (3-4%) was observed in Gr/Ge hybrids compared to Ge reference. In summary single layer transfer of graphene resulted in obtaining conductive Gr/$Al_2O_3$ and Gr/Ge hybrids with the sheet resistance 1-3 kΩ/sq.

Example 2

Figure 7A:
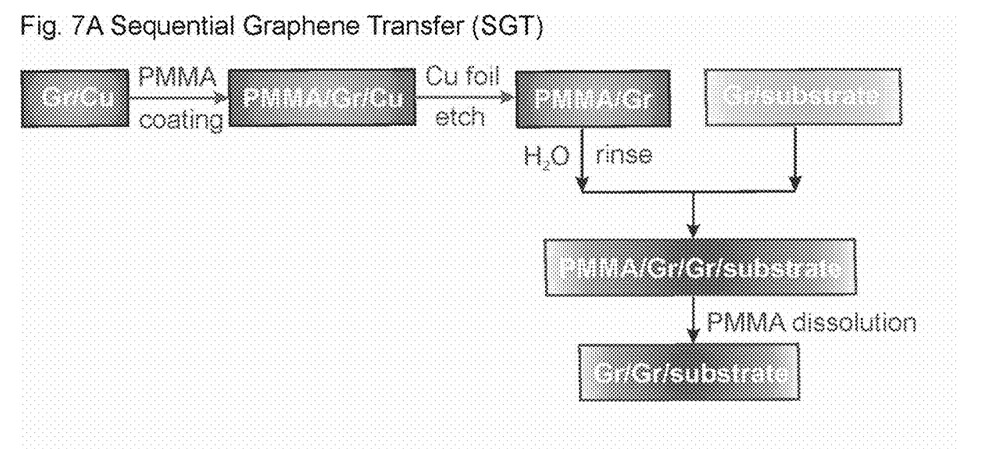
FIG. 7A is a schematic of sequential graphene transfer.
Figure 7B:
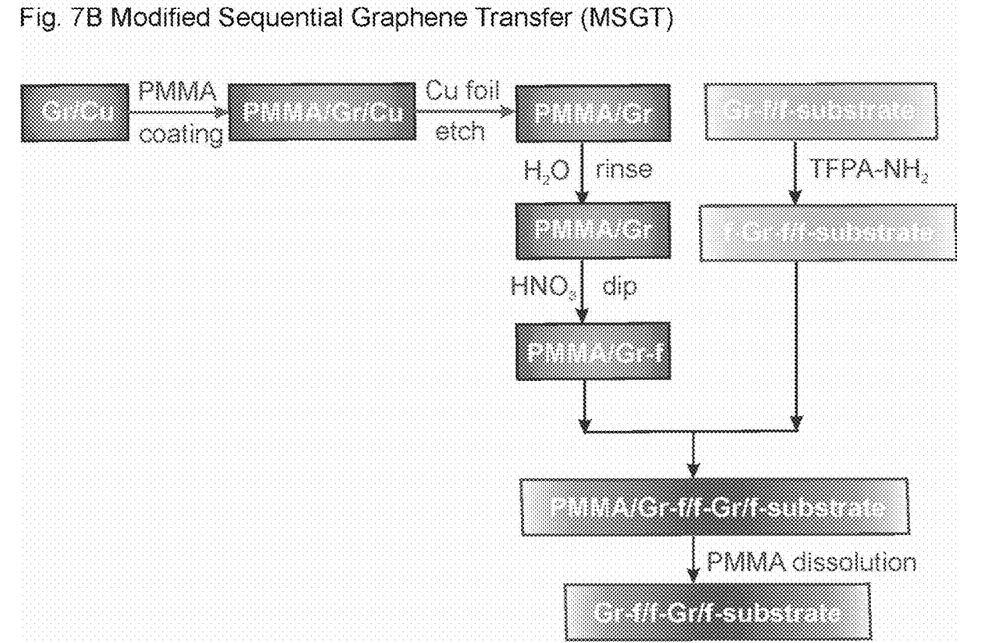
FIG. 7B is a schematic of modified sequential graphene transfer.

To further lower the resistance of the hybrid materials, the sequential transfer protocols were developed. First, graphene layers were sequentially placed on top of each other (SGT) following the OSGT protocols explained above. However, this approach did not yield the desired results. For this reason, in the modified sequential transfer protocol shown in FIG. 7, an additional step after the water rinsing of graphene to functionalize the bottom of the graphene in 2M $HNO_3$ solution in water (note the top graphene surface is protected with PMMA layer). Then, this functionalized surface is contacted with functionalized transparent surface (with TFPA-NH$_2$ molecules) and hydrogen bonds between the oxygen functional groups of graphene and NH$_2$ functionalities of the substrates are created. For sequential placement, the top graphene surface is functionalized by TFPA-NH$_2$ as well.

Figure 8:
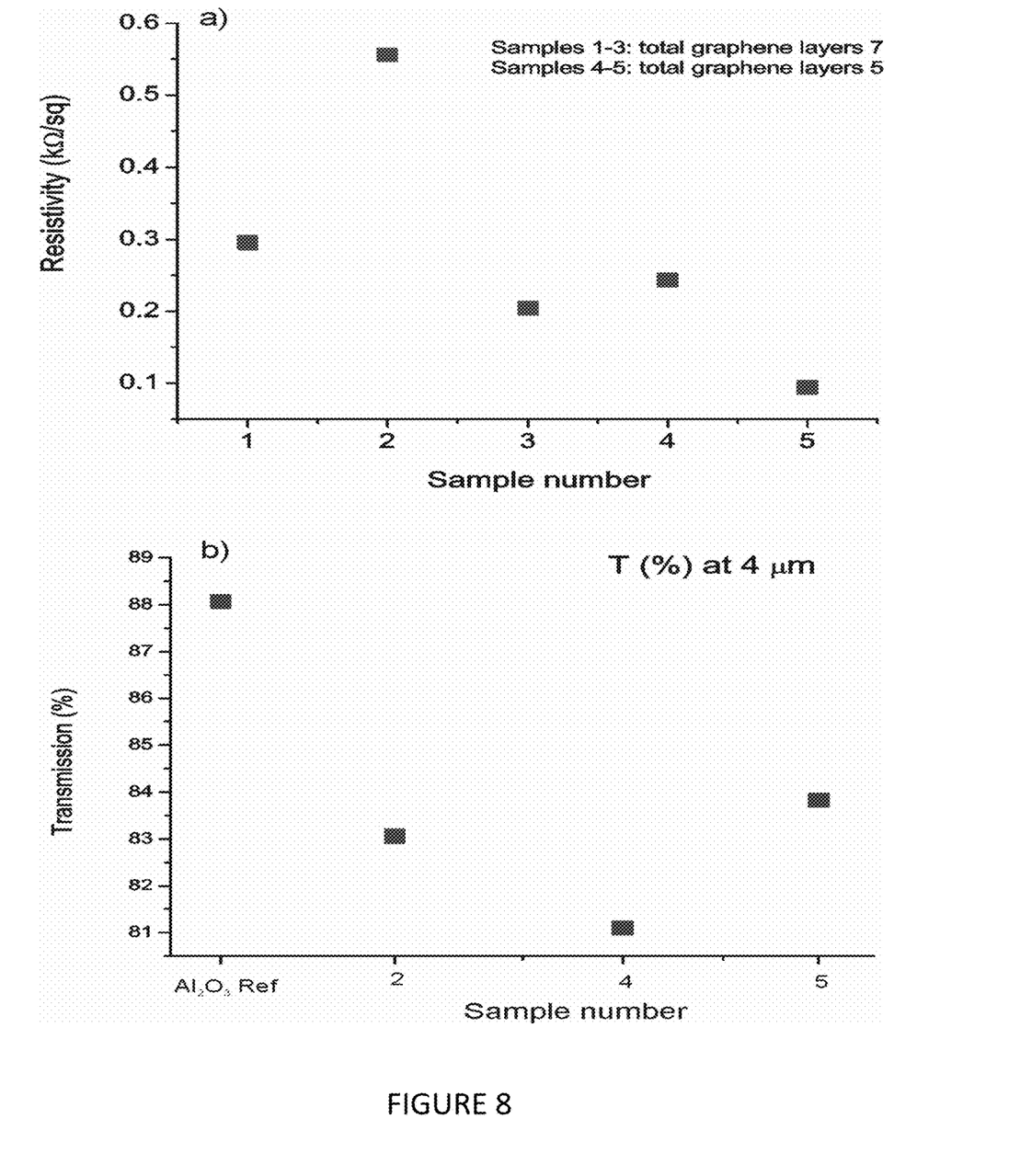

The electrical and optical results of sequential graphene transfer to Al$_2$O$_3$ are shown in FIG. 8 respectively. The sheet resistance values below 300 W/sq were achieved. Also, we found that the order in which graphene is layered mattered (2 L/3 L vs. 3 L/2 L; 2 L/2 L/3 L vs 6 L/1 L). Even though the total number of layers is the same—five layers—3 L/2 L had 250 Ohm/sq resistance vs. 100 Ohm/sq of 2 L/3 L. Similarly 2 L/2 L/3 L had 300 Ohm/sq resistance vs. 200 Ohm/sq resistance 6 L/1 L. The overall reduction of transmission was less than 10%, however the resistance values of Gr/Al$_2$O$_3$ approach ITO/Al$_2$O$_3$ values. The lowest obtained value was 100 Ohm/Sq.

Figure 9:
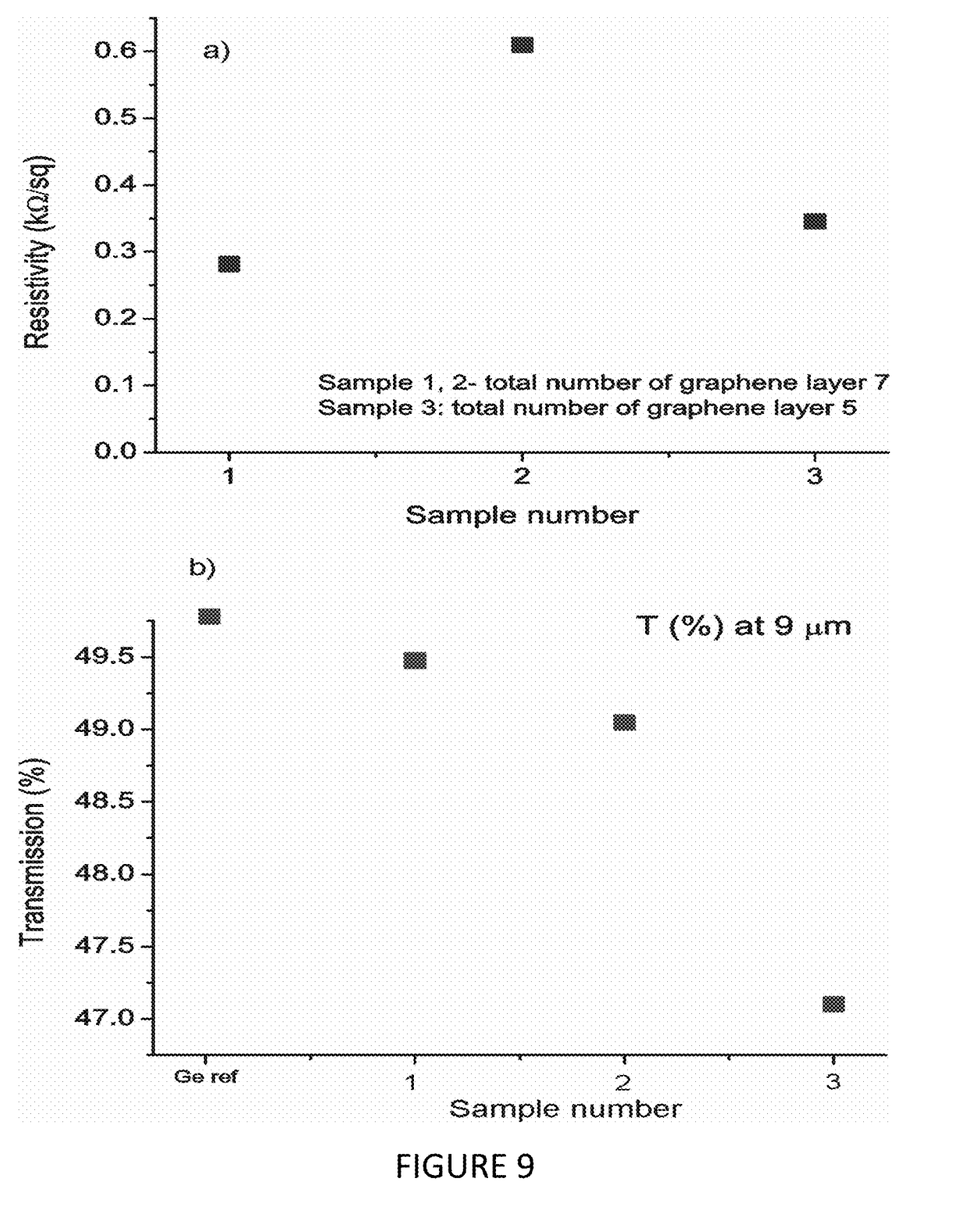
FIG. 9 illustrates optical and electrical measurements of Gr/Ge hybrid materials obtained using sequential transfer method. Sample 1 was prepared by placing 6 L of graphene Ge, functionalizing graphene on Ge and then transfer 1 L bottom functionalized graphene with $HNO_3$ onto it. Sample 2 was prepared by using 2 L/2 L graphene on Ge sample, functionalizing it and then transferring 3 L bottom functionalized graphene with $HNO_3$ onto it. Sample 3 was prepared by using 3 L graphene, functionalizing it by TFPA and then transferring 2 L bottom functionalized graphene with $HNO_3$ onto it.

To show to broad applicability of the proposed above approach, similar graphene layering experiments were conducted using germanium as well. Sheet resistance values below 600 Ohm/sq were achieved as well. The dependence of the way graphene layers were placed on the final resistance values was observed as well. Even though the total number of layers is the same (seven), when 6 L/1 L layered, the hybrid resistance was halves from 600 to 300 Ohm/in comparison to the 2 L/2 L/3 L combination (FIG. 9). The transmission difference for these samples was insignificant, as shown in FIG. 9.

Figure 10:
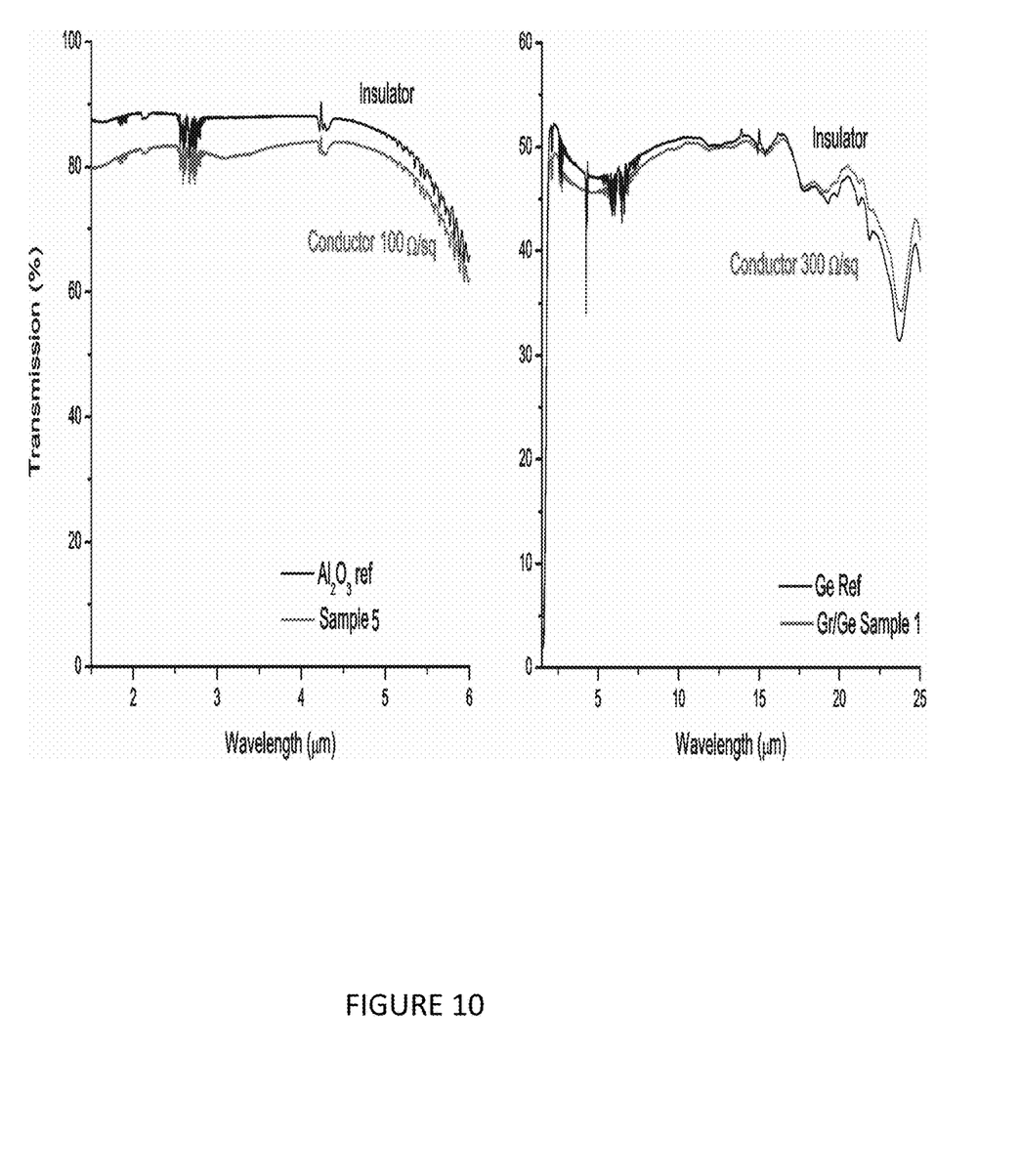
FIG. 10 illustrates transmission of $Al_2O_3$ and Ge reference and Gr/$Al_2O_3$ and Gr/Ge hybrid materials in the IR wavelengths.

In transmission spectra of insulators Al$_2$O$_3$ and Ge and the conducting Gr/Al$_2$O$_3$ and Gr/Ge are shown in FIG. 10. It is obvious, that the price in transmission is less than 10% over the whole IR range. The lowest obtained sheet resistance for the Al$_2$O$_3$ case was 100 Ohm/sq and for Ge 300 Ohm/sq. Applying the same method using different graphene layering combinations could further reduce these resistance values.

The same strategy can be applied in combination with the Lock et al. developed dry graphene transfer approach. The modified target substrates can be placed to HNO$_3$ modified graphene/Cu foil in the Nanoimprinter. After transfer print at 500 psi and 30 minutes, graphene can be removed from Cu foil. Then, graphene's top surface can be modified by TFPA-NH$_2$ to yield NH$_2$ functionalized surface and contacted again to HNO$_3$ modified graphene/Cu foil in the Nanoimprinter for sequential print.

Figure 11:
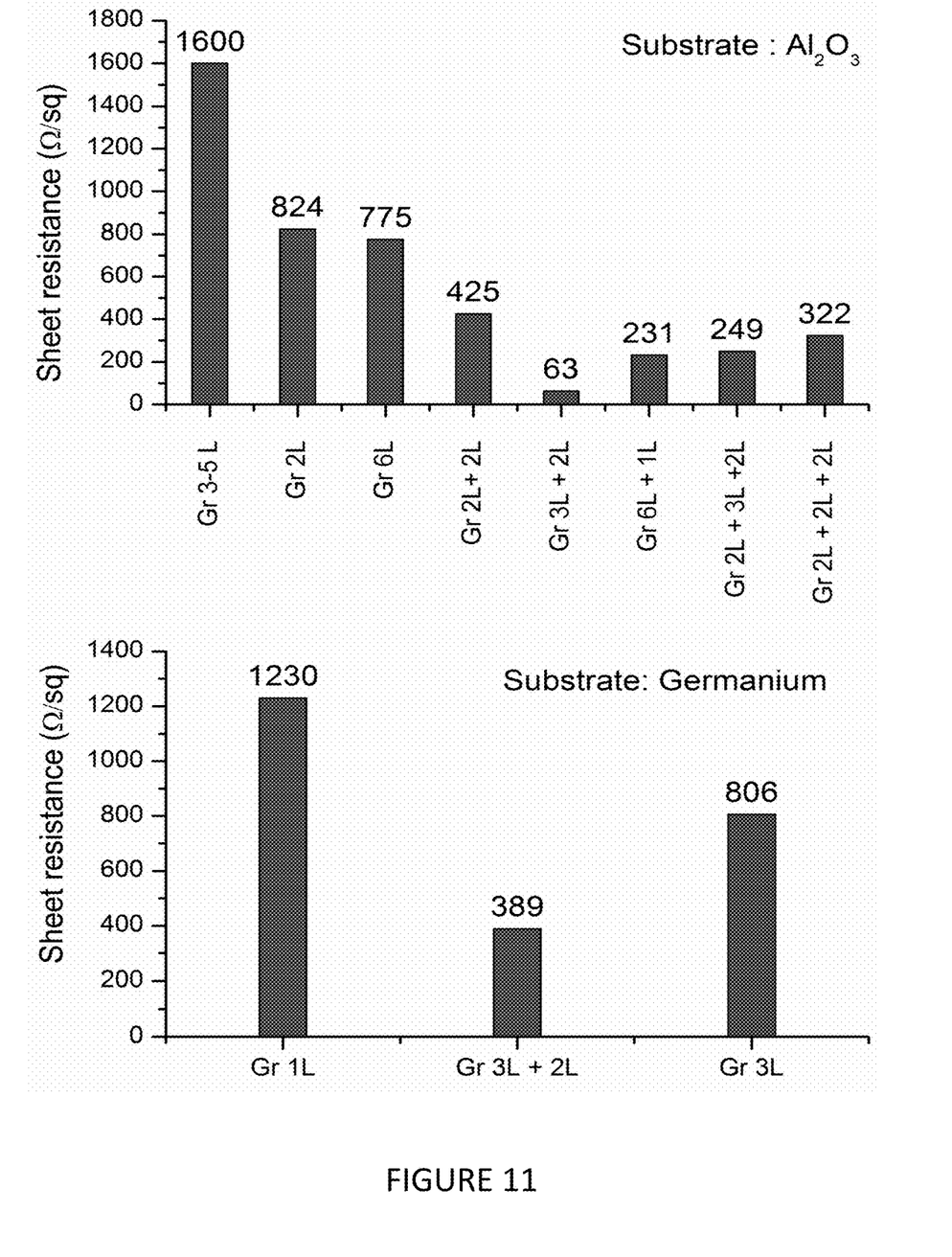
FIG. 11 illustrates sheet resistance measurements of Gr/$Al_2O_3$ nine months after graphene transfer.

The main drawback of the technologies developed to date is that the electrical resistance of chemically modified substrates degrades with time (seconds to minutes) after functionalization. To evaluate the stability of our samples, nine months after preparation, electrical and optical measurements on small subset of the Gr/Al$_2$O$_3$ and Gr/Ge was conducted. The results of electrical measurements are summarized in FIG. 11. It is clear that the sheet resistance values are similar to their original values. Thus, the hybrid materials, prepared using this methodology, have surfaces with stable electrical properties. The optical transparent properties were not changed as well.

Disclosed herein are conductive IR transparent substrates with electrical properties that do not degrade over time.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A method of making a transparent conductive graphene hybrid material, comprising the steps of:
    growing graphene on a first Cu foil to form a first graphene/Cu foil, wherein the graphene comprises a single layer or multilayer graphene;
    coating the first graphene/Cu foil with PMMA to form a first PMMA/Graphene/Cu foil hybrid;
    etching the first PMMA/graphene/Cu hybrid to form a first PMMA/graphene hybrid, wherein the first PMMA/graphene hybrid comprises a first bottom graphene surface and a first top graphene surface, wherein the first top graphene surface is adjacent to the PMMA of the first PMMA/graphene hybrid;
    rinsing the first PMMA/graphene hybrid with water;
    functionalizing the first bottom graphene surface of the first PMMA/graphene hybrid to dope the first bottom graphene surface and increase graphene reactivity;
    functionalizing an infrared (IR) transparent substrate;
    placing the functionalized first bottom graphene surface of the first PMMA/Graphene hybrid on the functionalized IR transparent substrate;
    removing the PMMA from the first PMMA/graphene hybrid to form a first graphene/substrate sheet allowing the first top graphene surface to be accessible;
    functionalizing the first top graphene surface of the first graphene/substrate sheet;
    coating a second graphene/Cu foil with PMMA to form a second PMMA/Graphene/Cu hybrid, wherein the graphene comprises a single layer or multilayer graphene;
    etching the second PMMA/graphene/Cu hybrid to form a second PMMA/graphene hybrid, wherein the second PMMA/graphene hybrid comprises a second bottom graphene surface and a second top graphene surface, wherein the second top graphene surface is adjacent to the PMMA of the second PMMA/graphene hybrid;
    rinsing the second PMMA/graphene hybrid with water;
    functionalizing the second bottom graphene surface of the second PMMA/graphene hybrid;
    sequentially layering two graphene coatings by contacting the functionalized first top graphene surface of the first graphene/substrate sheet with the functionalized second bottom graphene surface of the second PMMA/graphene hybrid; and
    removing the PMMA of the second PMMA/graphene hybrid to form a transparent conductive graphene hybrid material.

2. The method of making a transparent conductive graphene hybrid material of claim 1, wherein said step of functionalizing said first bottom graphene surface of the first PMMA/graphene hybrid comprises HNO$_3$, and wherein said step of functionalizing said first top graphene surface of the first graphene/substrate sheet comprises TFPA-NH$_2$.

3. The method of making a transparent conductive graphene hybrid material of claim 1, wherein said step of functionalizing the transparent substrate comprises plasma or chemicals.

4. The method of making a transparent conductive graphene hybrid material of claim 1, further including before said PMMA removal to form a transparent conductive graphene hybrid material, sequentially layering additional graphene coatings by repeating the following steps for each additionally desired graphene coating:

removing the PMMA from the second PMMA/graphene hybrid to form a second graphene/substrate sheet allowing the second top graphene surface to be accessible;

functionalizing the second top graphene surface of the second graphene/substrate sheet;

coating a third graphene/Cu surface with PMMA to form a third PMMA/graphene/Cu hybrid, wherein the graphene comprises a single layer or multilayer graphene;

etching the third PMMA/graphene/Cu hybrid to form a third PMMA/graphene hybrid, wherein the third PMMA/graphene hybrid comprises a third bottom graphene surface and a third top graphene surface, wherein the third top graphene surface is adjacent to the PMMA of the third PMMA/graphene hybrid;

rinsing the third PMMA/graphene hybrid with water;

functionalizing the third bottom graphene surface of the third PMMA/graphene hybrid; and contacting the functionalized second top graphene surface of the second graphene/substrate sheet with the functionalized third bottom graphene surface of the third PMMA/graphene hybrid.

5. The method of making a transparent conductive graphene hybrid material of claim 4, wherein said step of functionalizing the second bottom graphene surface of the second PMMA/graphene hybrid comprises $HNO_3$, and wherein the step of functionalizing the second top graphene surface of the second graphene/substrate sheet comprises $TFPA-NH_2$.

6. A product of the process of making a transparent conductive graphene hybrid material, comprising the steps of:

coating a first graphene/Cu foil surface with PMMA to form a first PMMA/Graphene/Cu foil hybrid, wherein the graphene comprises a single layer or multilayer graphene;

etching the first PMMA/graphene/Cu hybrid to form a first PMMA/graphene hybrid, wherein the first PMMA/graphene hybrid comprises a first bottom graphene surface and a first top graphene surface, wherein the first top graphene surface is adjacent to the PMMA of the first PMMA/graphene hybrid;

rinsing the first PMMA/graphene hybrid with water;

functionalizing the first bottom graphene surface of the first PMMA/graphene hybrid to dope the first bottom graphene surface and increase graphene reactivity;

functionalizing an infrared (IR) transparent substrate;

placing the functionalized first bottom graphene surface of the first PMMA/graphene hybrid on the functionalized IR transparent substrate;

removing the PMMA from the first PMMA/graphene hybrid to form a first graphene/substrate sheet allowing the first top graphene surface to be accessible;

functionalizing the first top graphene surface of the first graphene/substrate sheet;

coating a second graphene/Cu foil with PMMA to form a second PMMA/Graphene/Cu hybrid, wherein the graphene comprises a single layer or multilayer graphene;

etching the second PMMA/graphene/Cu hybrid to form a second PMMA/graphene hybrid, wherein the second PMMA/graphene hybrid comprises a second bottom graphene surface and a second top graphene surface, wherein the second top graphene surface is adjacent to the PMMA of the second PMMA/graphene hybrid;

rinsing the second PMMA/graphene hybrid with water;

functionalizing the second bottom graphene surface of the second PMMA/graphene hybrid;

sequentially layering two graphene coatings by contacting the functionalized first top graphene surface of the first graphene/substrate sheet with the functionalized second bottom graphene surface of the second PMMA/graphene hybrid; and removing the PMMA of the second PMMA/graphene hybrid to form a transparent conductive graphene hybrid material.

7. A transparent conductive graphene hybrid comprising:
a functionalized transparent substrate;
a first coating of graphene on the functionalized transparent substrate, wherein the first coating of graphene comprises a single layer or multilayer graphene, wherein the first coating of graphene comprises a first top graphene surface and a first bottom graphene surface, wherein the first bottom surface is functionalized with $HNO_3$ and bonded to the functionalized transparent substrate, wherein the first top layer of graphene surface is functionalized with $TFPA-NH_2$; and
a second coating of graphene, wherein the second coating of graphene comprises a single layer or multilayer graphene, wherein the second coating of graphene comprises a second top graphene surface and a second bottom graphene surface, wherein the second bottom graphene surface is functionalized with $HNO_3$, and wherein functionalized second bottom graphene surface is bonded to the functionalized first top graphene surface.

8. The method of making a transparent conductive graphene hybrid material of claim 1, wherein said step of functionalizing said second bottom graphene surface of the second PMMA/graphene hybrid comprises $HNO_3$.

9. The method of making a transparent conductive graphene hybrid material of claim 4, wherein said step of functionalizing said third bottom graphene surface of the third PMMA/graphene hybrid comprises $HNO_3$.

10. The product of claim 6, wherein said step of functionalizing said first bottom graphene surface of the first PMMA/graphene hybrid comprises $HNO_3$, and wherein said step of functionalizing said first top graphene surface of the first graphene/substrate sheet comprises $TFPA-NH_2$.

11. The product of claim 6, wherein said step of functionalizing the second bottom graphene surface of the second graphene/substrate sheet comprises $HNO_3$.

12. The product of claim 6, further including before said PMMA removal to form a transparent conductive graphene hybrid material, sequentially layering additional graphene coatings by repeating the following steps for each additionally desired graphene coating:

removing the PMMA from the second PMMA/graphene hybrid to form a second graphene/substrate sheet allowing the second top graphene surface to be accessible;

functionalizing the second top graphene surface of the second graphene/substrate sheet;

coating a third graphene/Cu surface with PMMA to form a third PMMA/graphene/Cu hybrid, wherein the graphene comprises a single layer or multilayer graphene;

etching the third PMMA/graphene/Cu hybrid to form a third PMMA/graphene hybrid, wherein the third PMMA/graphene hybrid comprises a third bottom graphene surface and a third top graphene surface, wherein the third top graphene surface is adjacent to the PMMA of the third PMMA/graphene hybrid;

rinsing the third PMMA/graphene hybrid with water;

functionalizing the third bottom graphene surface of the third PMMA/graphene hybrid; and contacting the functionalized second top graphene surface of the second graphene/substrate sheet with the functionalized third bottom graphene surface of the third PMMA/graphene hybrid.

13. The product of claim 12, wherein said step of functionalizing said second bottom graphene surface of the second PMMA/graphene hybrid comprises $HNO_3$, and wherein the step of functionalizing the second top graphene surface of the first graphene/substrate sheet comprises $TFPA-NH_2$.

14. The product of claim 12, wherein said step of functionalizing said third bottom graphene surface of the third graphene/substrate sheet comprises $HNO_3$.

15. The transparent conductive graphene hybrid of claim 7, additionally comprising a third coating of graphene, wherein the third coating of graphene comprises a single layer or multilayer of graphene, wherein the third coating of graphene comprises a third top graphene surface and a third bottom graphene surface, wherein the second top graphene surface is functionalized with $TFPA-NH_2$, wherein the third bottom graphene surface is functionalized with $HNO_3$, and wherein the functionalized second top graphene surface is bonded to the functionalized third bottom graphene surface.

16. The transparent conductive graphene hybrid of claim 15, additionally comprising additional coatings of graphene, wherein each additional coating of graphene comprises a single layer or multilayer of graphene, comprises a top graphene surface, comprises a bottom graphene surface functionalized with $TFPA-NH_2$ and attached to a coating of graphene functionalized with $HNO_3$.

* * * * *